(12) United States Patent
Wiesler et al.

(10) Patent No.: US 6,384,601 B1
(45) Date of Patent: May 7, 2002

(54) LOCAL MAGNETIZATION SPOILING USING A GRADIENT INSERT FOR REDUCING THE FIELD OF VIEW IN MAGNETIC RESONANCE IMAGING

(75) Inventors: David G. Wiesler, Bethesda; Han Wen, Rockville; Robert S. Balaban, Bethesda, all of MD (US); Steven D. Wolff, New York, NY (US)

(73) Assignee: The United States of America as represented by the Secretary of Department of Health & Human Services, Washington, DC (US)

( * ) Notice: Subject to any disclaimer, the term of this patent is extended or adjusted under 35 U.S.C. 154(b) by 0 days.

(21) Appl. No.: 09/403,530

(22) PCT Filed: Apr. 6, 1998

(86) PCT No.: PCT/US98/06787

§ 371 Date: Jun. 19, 2000

§ 102(e) Date: Jun. 19, 2000

(87) PCT Pub. No.: WO98/47014

PCT Pub. Date: Oct. 22, 1998

(51) Int. Cl.$^7$ .................................................. G01V 3/00
(52) U.S. Cl. ........................ 324/309; 324/312; 324/322
(58) Field of Search ............................... 324/309, 318, 324/312, 322

(56) References Cited

U.S. PATENT DOCUMENTS 5,235,279 A    8/1993   Kaufman et al. ............ 324/309

OTHER PUBLICATIONS

Wiesler, D.G. et al., "Localized Imaging Using Slice–Select Spoiling", 1997 Abstract for Scientific Presentation, International Society for Magnetic Resonance in Medicine, Fifth Scientific Meeting.

Chen et al., "Spatially–localized NMR Spectroscopy Employing an Inhomogeneous Surface–Spoiling Magnetic Field Gradient", NMR in Biomedicine, vol. 3, No. 4, 1990.

Chen, C., et al., "Surface–Coil Spin–Echo Localization in Vivo via Inhomogeneous Surface–Spoiling Magnetic Gradient", J. of Magnetic Resonance, 82, 655–658 (1989).

Jehenson, P., et al., "Elimination of Surface Signals by a Surface–Spoiling Magnetic Field Gradient. Theoretical Optimization and Application to Human in Vivo NMR Spectroscopy",J. of Magnetic Resonance, 94: 59–72 (1991).

Primary Examiner—Jay Patidar
Assistant Examiner—Brij B. Shrivastav
(74) Attorney, Agent, or Firm—Fitch, Even, Tabin & Flannery

(57) ABSTRACT

A method, and related apparatus, for suppressing the magnetic resonance signal to an experimentally adjustable depth by applying a spatially inhomogeneous field between the slice-select pulse and the data acquisition. Eliminating the signal from near surface regions allows one to shrink the field of view of an image without introducing aliasing artifacts, thereby improving the image's resolution or decreasing imaging time. Experimental tests on a phantom and a human subject indicate that the depth of signal suppression may be continuously varied to depths of over 80 millimeters with modest requirements on power supplies, pulse sequences, and materials.

10 Claims, 9 Drawing Sheets

LOCAL MAGNETIZATION SPOILING USING A GRADIENT INSERT FOR REDUCING THE FIELD OF VIEW IN MAGNETIC RESONANCE IMAGING

BACKGROUND OF THE INVENTION

The present invention relates to magnetic resonance imaging, and more particularly, to magnetic resonance imaging over a reduced field of view using local gradient spoiling.

Magnetic resonance imaging (MRI) uses strong, homogeneous static and gradient magnetic fields and carefully timed rf pulses to produce noninvasive images of organs or tissues within a patient's body. MRI provides significant advantages over x-ray, ultrasound, or other imaging techniques. However, MRI produces various image artifacts under certain imaging conditions such as motion.

Other aliasing artifacts occur whenever the field of view (FOV) of the image becomes smaller than the size of the object being imaged. In such a case, the parts of the object that extend outside the FOV are wrapped back into the image on the opposite side. In the readout direction, aliasing can be avoided without affecting the scan time and resolution by oversampling at a higher frequency during the readout period. In the phase-encode direction, the analogous solution is to increase the number of phase-encode lines per image, increasing the scan time.

For applications in which fast, high resolution scans are desired, aliasing artifacts must be addressed in other ways. An example of this is Cardiac MRI, which requires resolution of a few millimeters (mm) or better and must be performed quickly because of cardiac and respiratory motion. Yet, the region of interest (the heart) is small compared to the subject size, and if the FOV could be reduced without aliasing artifacts compromising the image quality, large savings in scan time would result.

One way to address the reduced FOV aliasing problem is to reduce or eliminate the magnetic resonance (MR) signal from outer regions of the subject, i.e., those regions which would wrap back into the region of interest when the FOV is reduced. Such reduction or minimization of the MR signal is referred to in the art as "spoiling". The ways to accomplish this are broadly classified by whether they use the RF or static fields to achieve spatial differentiation.

In the first category, surface coils are effective in reducing the signal from the interior, but not from the surface. Further, depth pulse sequences using surface coils may effectively suppress the surface signal, but require a long pulse preparation time and rely on a large flip angle, both of which increase the imaging time. Surface saturation may be used, but this method also adds time for the spin preparation and does not entirely eliminate the signal from fast-relaxing regions, e.g., subcutaneous fat. RF shielding with metal-fiber blankets works well in eliminating signals from the extremities, but it is ineffective in screening out the magnetic field from shoulder and torso surfaces when penetration into the torso is to be maintained. A passive eddy current spoiler may eliminate near-surface MR signals, but this technique requires linearly polarized rf, the effective depth is not adjustable in situ, and it may not provide effective spoiling over a large area.

The second approach to reducing the field of view aliasing problem is to dephase the excited spins in outlying regions or to distort their apparent position using local magnetic field gradients. To date, these methods have had only moderate success. For example, ferromagnetic and paramagnetic materials inserted into the scanner establish large, local static field gradients. Unfortunately, the spoil depth for these materials is not adjustable, and large areas cannot simultaneously be spoiled. Higher order shim coils have been used to distort the edges of the image so that it can "hold" the entire sample or patient even with a small FOV. However, power requirements for this technique are prohibitively large, and a loss of dynamic range results because magnetization from a large part of the patient gets concentrated into a small region of the image.

Two other methods of magnetization spoiling have been used in MR spectroscopy for volume localization, but not for FOV reduction or faster scanning. Topical magnetic resonance (TMR) uses high-order shim coils to make the field homogeneous only in the central region of the magnet. However, incorporating this technique into imaging protocols appears difficult because of the large power requirements in human-sized scanners. In contrast, use of a local gradient insert, such as that designed by Chen and Ackerman for $^{31}P$ spectroscopy of rat liver has potential in imaging applications as well as in spectroscopy. (W. Chen and J. Ackerman, Spatially-Localized NMR Spectroscopy Employing an Inhomogeneous Surface-Spoiling Magnetic Field Gradient, NMR in Biomedicine, Vol. 3, No. 4 (1990)). The main difficulty with the Chen and Ackerman approach is in scaling up the device to spoil to depths of more than a few millimeters while maintaining modest current requirements.

Accordingly, there exists a need for cost effective methods and related apparatus for the prompt and reliable imaging with a reduced FOV of a large object. The present invention satisfies these needs.

SUMMARY OF THE INVENTION

The present invention is embodied in a method, and related apparatus, of spoiling the magnetic resonance signal during imaging to an experimentally adjustable depth by means of a gradient insert, so that the image's FOV may be reduced without aliasing artifacts and the images may be collected more quickly. The present invention provides a spoiling gradient suitable for human-scale imaging that is capable of achieving controlled-depth spoils of 80 millimeters under a wide variety of scan protocols. The apparatus and method of the invention have been experimentally verified using phantoms and a human subject. Use of the apparatus and method enables imaging times to be reduced by as much as half without loss of resolution.

BRIEF DESCRIPTION OF THE DRAWINGS

The above and other aspects, features and advantages of the present invention will be more apparent from the following more particular description thereof, presented in conjunction with the following drawings, wherein.

Corresponding reference characters indicate corresponding components throughout the several views of the drawings.

DETAILED DESCRIPTION OF THE PREFERRED EMBODIMENTS

The following description is of the best mode presently contemplated for carrying out the invention. This description is not to be taken in a limiting sense, but is made merely for the purpose of describing the general principles of the invention. The scope of the invention should be determined with reference to the claims.

The present invention is embodied in a method, and related apparatus, for suppressing a magnetic resonance signal from regions outside of a field of interest to allow improved magnetic resonance imaging within the field of interest or field of view (FOV). The magnetic resonance (MR) signal is suppressed by a spoiler current pulse that creates, for a specified time duration, a locally inhomogeneous magnetic field outside of the FOV, thus spoiling the magnetic resonance image (MRI) from the regions subjected to the spoiling magnetic fields. The present invention is particularly advantageous for rapidly obtaining cardiac or similar images that are not corrupted with aliasing artifacts or the like.

Figure 1:
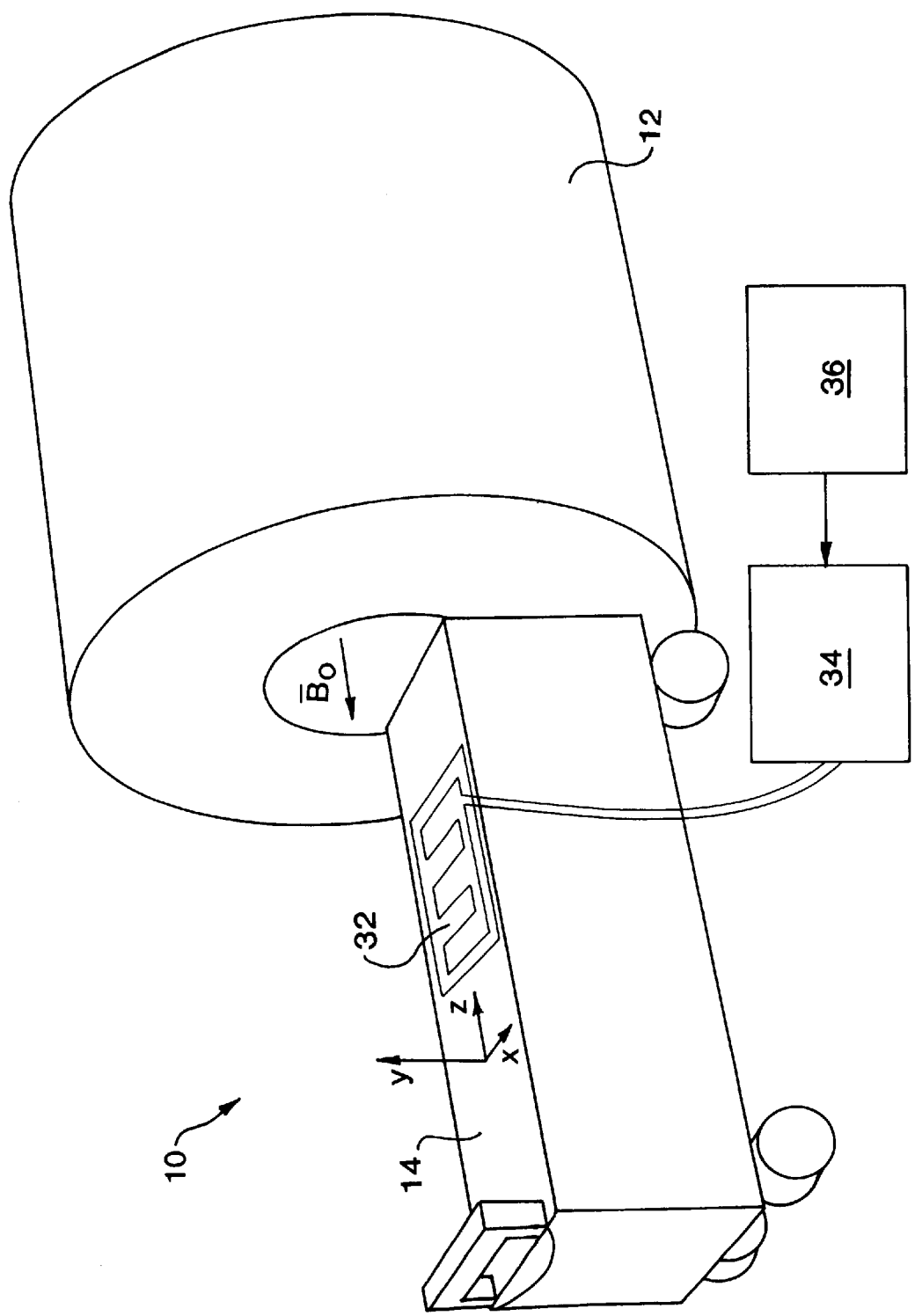
FIG. 1 is a perspective view of a MRI system with the spoiler gradient insert of the present invention and an included block diagram of the current control system.

An apparatus 10 for obtaining an MRI in accordance with the present invention is shown in FIG. 1. The MRI apparatus includes a typical MRI system that has a large cylindrical magnet 12 that generates a magnetic field $B_0$. Inside the cylinder, the magnetic field is aligned along the axis of the cylinder. A three-dimensional laboratory reference frame is defined with the z-axis aligned along the axis of the cylinder, the x-axis extending in a perpendicular horizontal direction, and the y-axis extending in a perpendicular vertical direction. A horizontal platform 14 is configured to move along the z-axis for transporting and positioning a patient (not shown) within the large magnet. Generally, the large magnet is a superconducting magnet that generates a uniform magnetic field. During imaging, magnetic coils (not show n), activated by controlled currents, induce a linear magnetic gradient in specified planes through the patient. The coils are configured and the currents through them are controlled such that a magnetic gradient may be induced in any plane through the patient.

Figure 2:
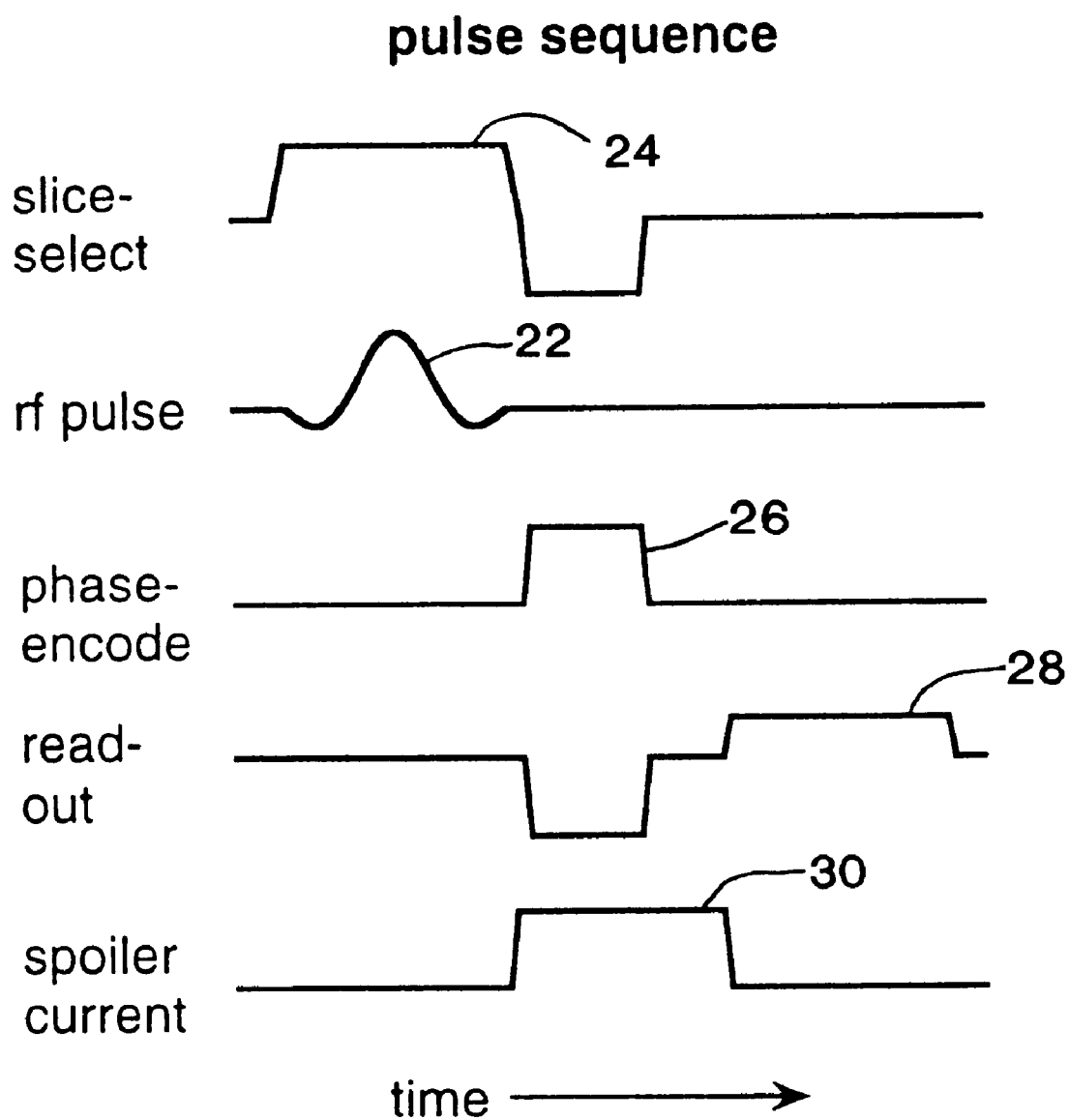
FIG. 2 is a schematic diagram showing the timing of the spoiler current (bottom) with respect to a typical pulse sequence for gradient recalled echo (GRE) imaging.

One of the most common imaging sequences is the gradient recalled echo (GRE) sequence, illustrated by the top four curves in FIG. 2. Before the sequence begins, the main field $B_0$ aligns the spins preferentially in the z-direction. Simultaneous application of a slice-select gradient 22 and a RF pulse 24 causes nuclear spins within a slice perpendicular to the gradient direction to tip somewhat into the transverse plane, where they begin to precess about the z-axis. The rate of precession is proportional to the field strength. Imaging is done by applying gradients in the two in-plane directions (the directions of the phase-encode 26 and readout 28 pulses). In this way spatial coordinates are encoded by the rate of precession of the spins, which can be determined by Fourier transforming a measured signal of current versus time from an rf receiver.

Figure 3:
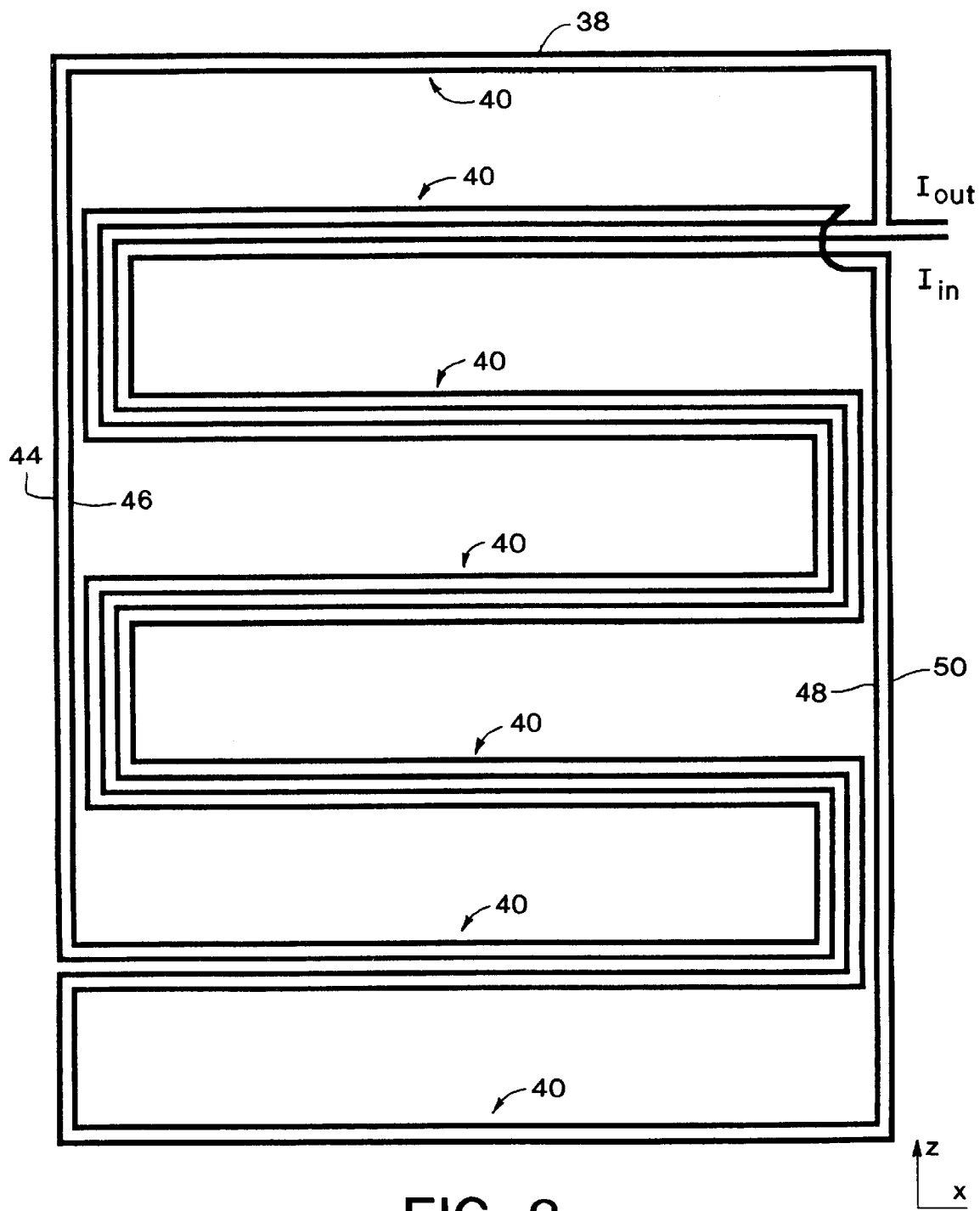
FIG. 3 is a schematic diagram of the coil for the spoiler gradient insert of FIG. 1.

In order for a signal to be measured from a volume element (voxel), the spins within that voxel must be in phase with one another. In the method of the present invention, local image spoiling is accomplished by scrambling the phases of the nuclear spins locally by means of a current-controlled spoiler gradient applied during the imaging sequence. The spoiler gradient is generated by a pulsed spoiler current 30 that is applied through an insert 32 that is placed on the platform (FIG. 1) underneath the patient. The current is supplied by a power amplifier 34 that is triggered by the MRI system's scanning control system 36. The insert has a current path 38 as shown in FIG. 3. As discussed in more detail below, the current path is configured to reduce the torque that the insert is subjected to by the spoiler current's interaction with the large magnetic field $B_0$.

The spoiler gradient insert produces a magnetic field at time t and position r having a component along the main magnetic field direction, i.e., the z-axis, that is denoted as $B_s(r,t)$. As long as the field is not applied during the rf or readout pulses, its sole effect is to introduce a phase shift as given in the following equation:

$$\phi(\vec{r}) = \gamma \int_{t}^{t+T} dt B_S(\vec{r}, t) \qquad (1)$$

where $\gamma$=26.75 kHz/G and is the proton gyromagnetic ratio and T is the duration of the spoiler pulse. Variations of the phase shift across a voxel (a volume element) lead to signal suppression from that voxel. If the field is designed so that $\phi$ varies by more than $2\pi$ across a voxel in any direction, then the signal from that voxel will be essentially eliminated from the image.

To describe the spoil field further, the length of a voxel in the readout, phase-encode and slice-select directions may be denoted as $\Delta r$, $\Delta p$ and $\Delta s$, respectively, and r, p, and s as the spatial coordinates in those directions. If the voxel is sufficiently small so that the magnetization density can be considered constant over it, then the fraction of signal $\xi$ at position $\vec{r}$=(R,P,S) remaining after spoiling is given by the following equation:

$$\xi(R,P,S) = \int\int\int dr\, dp\, ds\, \exp[i\phi(R,P,S)]f(R-r, P-p, S-s), \qquad (2)$$

where $\xi$ is termed the spoil factor and where f(R−r,P−p,S−s) is the point-response function for the voxel centered at (R,P,S). The point response function depends on the details of filtering and on the rf profile, although its exact shape is unimportant for this derivation. For computational simplicity, a product of Gaussian functions in each of the principal directions is assumed as indicated by the following equation:

$$f(r, p, s) = \frac{1}{(2\pi)^{3/2}\sigma_r\sigma_p\sigma_s}\exp\left(-\frac{r^2}{2\sigma_r^2}\right)\exp\left(-\frac{p^2}{2\sigma_p^2}\right)\exp\left(-\frac{s^2}{2\sigma_s^2}\right). \quad (3)$$

where $\sigma_i$ are the standard widths of the response function equal to $(8 \ln 2)^{-\frac{1}{2}}$ times the voxel widths $\Delta r$, $\Delta p$ and $\Delta s$.

Locally, the spoiler field can be expanded in a Taylor Series. Since the range of integration (the voxel size) is small on the scale of the field variation, only first order terms are retained:

$$B_s(r,p,s,t) = B_s(R,P,S,t) + (r-R)G_r(R,P,S,t) + (p-P)G_p(R,P,S,t) + (s-S)G_s(R,P,S,t) \quad (4)$$

where $G_r$, $G_p$, and $G_s$ represent the local field gradients in the r, p, and s directions. Combining equations 1 through 4, the spoil factor for a constant pulse of duration T becomes:

$$\xi(R, P, S) = \quad (5)$$
$$\exp[i\gamma TB_s(R, P, S)]\exp\left[-\frac{(\gamma T)^2}{16\ln 2}((G_r\Delta r)^2 + (G_p\Delta p)^2 + (G_s\Delta s)^2)\right]$$

The first factor is an overall phase shift, which does not affect the image intensity. The second factor represents intervoxel dephasing from the gradient insert. Equation 5 indicates that the signal can be suppressed by sufficiently increasing the product of the gradient in any direction, the size of the voxel in that direction, and the time the spoiling field is applied. For a given (0 gradient size, spoiling is the most efficient in the direction having the largest voxel dimension.

As shown by Equations 1 through 5, the spoil depth is maximized for a given gradient geometry by maximizing the time integral of the spoiler gradient. The spoiler gradient should be zero during the rf pulse 22 and during data acquisition, which occurs during the positive portion of the readout pulse 28 (See FIG. 2), to prevent it from interfering with spin excitation and imaging. Therefore, the current through the spoiler gradient insert should be a square pulse that is off during the rf pulse, as shown by the bottom curve 30 in FIG. 2.

The spoiler magnetic field must have a spatial gradient that is large near the surface and negligibly small in the bulk of the patient. A simple configuration for the current path 38 through the insert 32 is a linear array of antiparallel current elements 40, with each current element providing a current path that is perpendicular to the main field direction (z-axis). A single current path, however, would require either a relatively large current, e.g., over 100 Amperes (A), or long dephasing times, e.g., 5 milliseconds (ms), to generate a spoil depth of 50 millimeters (mm). Furthermore, a single current path encloses a large area thus causing the spoiler gradient insert to be susceptible to large torques as the current through the insert is switched on and off in the presence of the large main magnetic field within the MRI system.

A preferred configuration for the current path 38 within the insert 32 is shown in FIG. 3. Between the antiparallel current elements 40 there is an average spacing of 76 mm. The length of each current element is about 305 mm. Also, each of the main current elements includes four closely spaced wires 42 arranged in series to reduce the current requirements. Further, the return paths 44, 46, 48 and 50 for each of the four series loops, respectively, are configured to cancel (minimize) the magnetic forces and net torque on the circuit. More particularly, two of the loops are supplied by current paths 44 and 46 along the one side of the insert and the remaining current loops are supplied by current paths 48 and 50 along the opposite side of the insert. The overall dimensions of the current path is about 360 mm in the x-direction by 460 mm in the z-direction.

In the present implementation, current paths were formed of copper magnet wire having a diameter of 3 millimeters potted with epoxy into a rigid planar board. Additional electrical insulation and mechanical rigidity were provided by covering the assembly with a 16 millimeter thick board (not shown). The top board also serves to separate the spoiler gradient insert from the rf coil to reduce coupling between them.

Figure 4A:
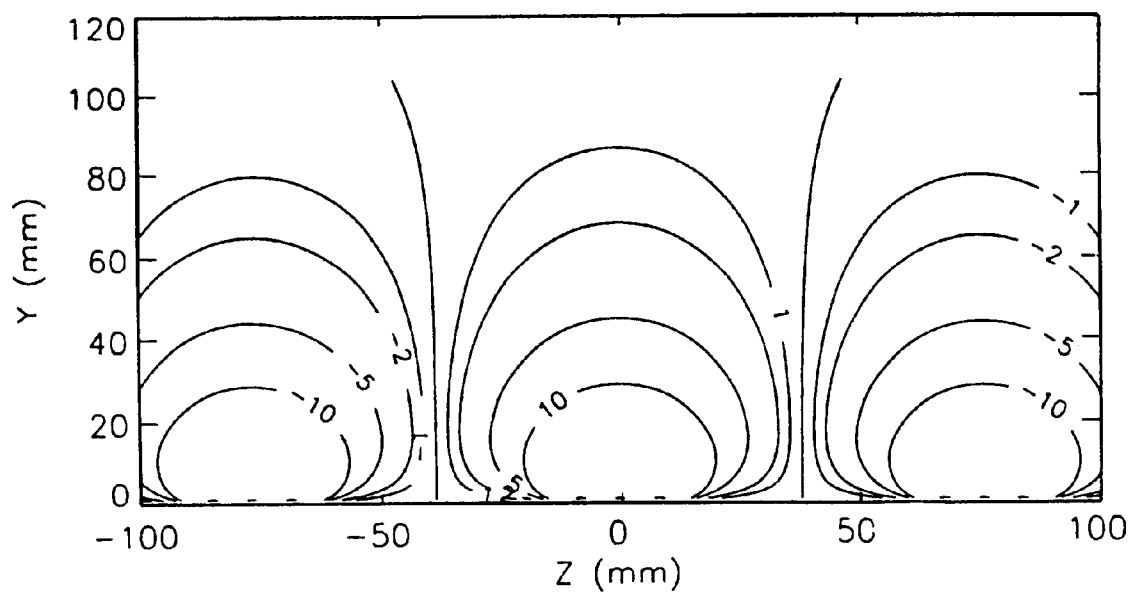
FIG. 4A is a contour plot of the z-component of the field generated by the spoiler insert at a current of 100 Amperes (A) as a function of distance from the insert, y, and position along the insert z.
Figure 4B:
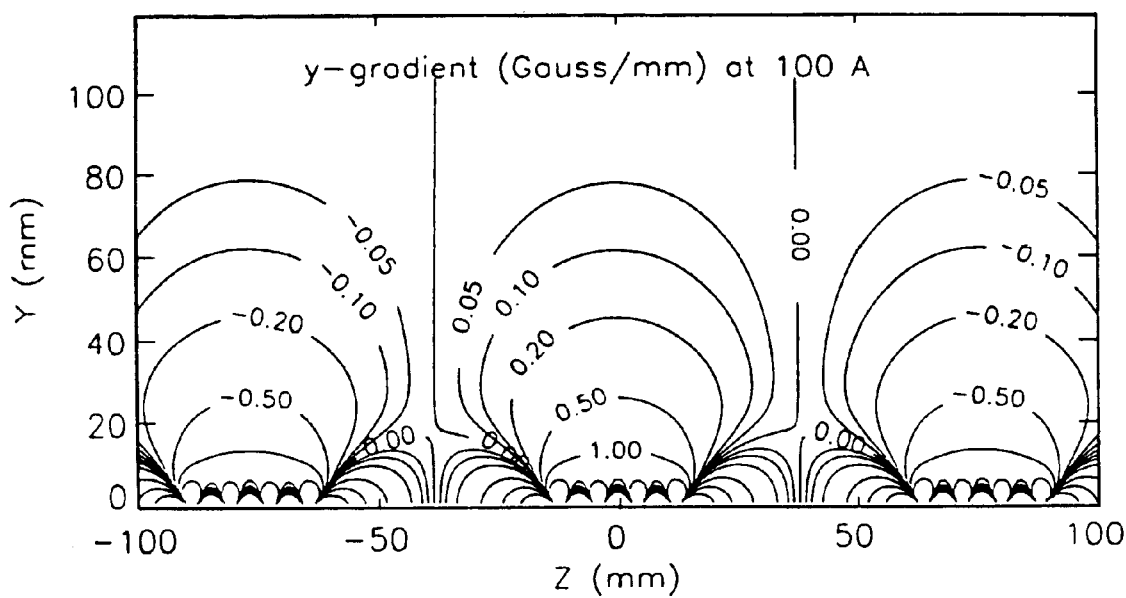
FIG. 4B is a contour plot of the y-gradient of the spoiler field shown in FIG. 4A.
Figure 4C:
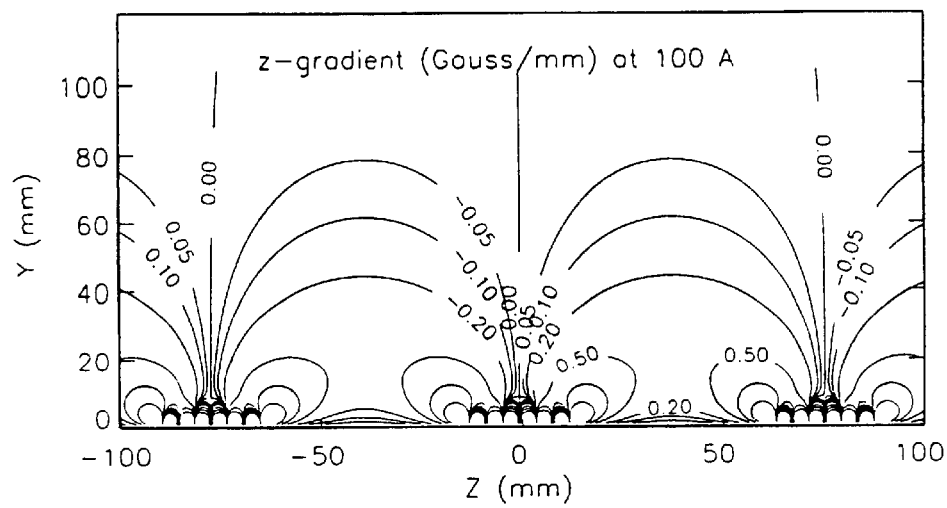
FIG. 4C is a contour plot of the z-gradient of the spoiler field shown in FIG. 4A.

The magnetic field generated by the current flowing through the insert 32 is calculated using the Biot-Savart equation. Calculated models of the magnetic field contour lines of the z-component for the magnetic field generated by a 100 A current through the insert are shown in FIG. 4A. The calculations assume that the antiparallel elements 40 extend to infinity in the x-direction. As indicated by equation 5, the imaging magnetization is spoiled whenever the spoiler gradients in either the y- or z-directions are sufficiently large. (Gradients in the x-direction are negligibly small, since the field is independent of x, except very near the outer edges of the spoiler insert.) FIGS. 4B and 4C show the contours of the y- and z-gradients, respectively, for an insert spoiler current of 100 A. It is readily observable that the region over the antiparallel elements is spoiled most effectively by the y-gradient, and the region between the current element by the z-gradient.

Figure 4D:
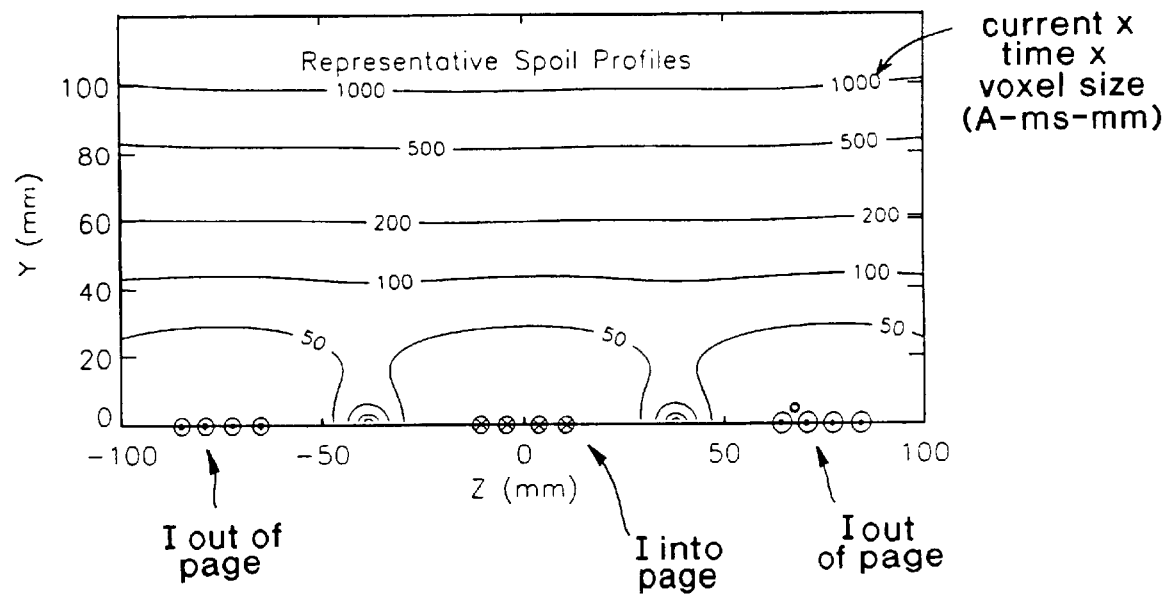
FIG. 4D is a contour plot of the combined spoil depth profiles arising from the y- and z-gradients in FIGS. 4B and 4C for specified products of current (in A), dephasing time (ms), and voxel dimension (mm).
Figure 5A:
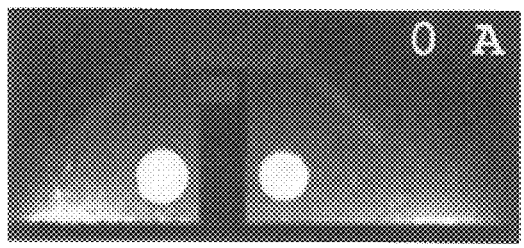
FIGS. 5A through 5H are images of a phantom at increasing currents through the spoiler insert of FIG. 3, indicating spoil depth control.
Figure 5E:
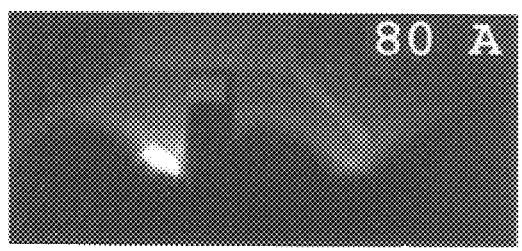
Figure 5B:
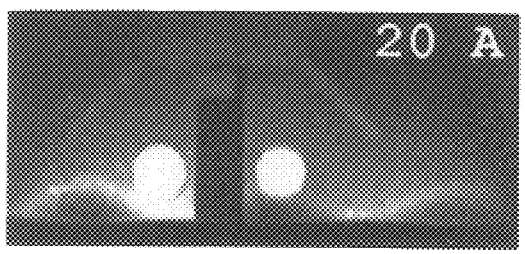
Figure 5F:
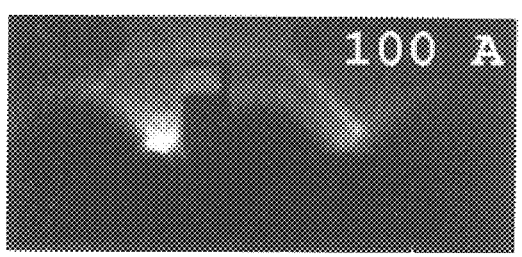
Figure 5C:
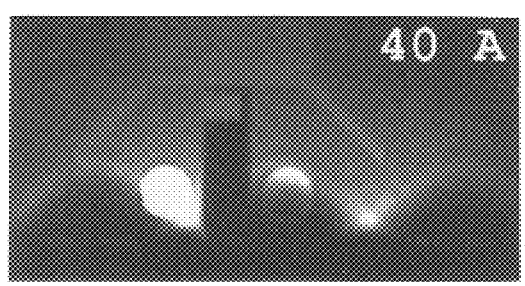
Figure 5G:
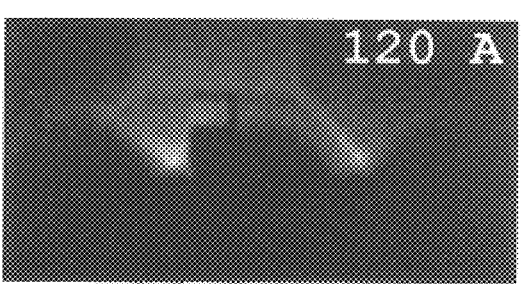
Figure 5D:
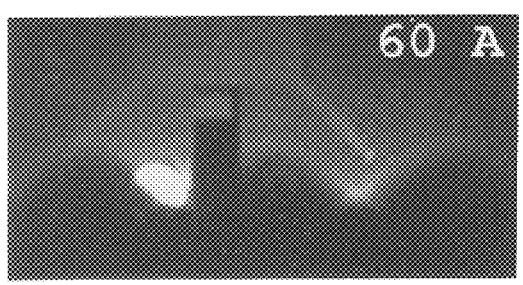
Figure 5H:
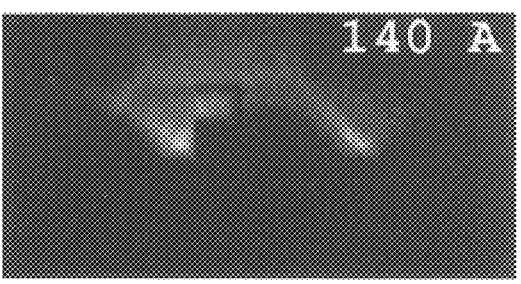

The depth of the resulting spoil profile can be tuned by adjusting the product of the current, spoil time, and voxel size, as calculated using equation 5 and shown in FIG. 4D. Lines there represent a spoil factor of 5% for cubic voxels at specified products of current (A), spoil duration (ms) and voxel length (mm). If this product is less than about 100 A-ms-mm, or if the voxel dimensions are not comparable, the spoil profile becomes uneven or scalloped. Otherwise, a nearly uniform spoil depth results.

Empirical tests of the performance of the spoiler gradient insert 32 were conducted by performing proton GRE imaging with and without surface spoiling. Experiments were conducted in a 1 meter bore 4T (Oxford) or 1.5 T (General Electric) magnet using a Signa (5.x) console (GE). In both systems a gradient insert coil amplifier (Model 8607, Techron, Crown International, Elkhart, Ind.) with a 140A peak current was driven through a function generator (Model DS 345/1, Stanford Research Systems, Sunnyvale, Calif.) triggered using the Signa scope trigger. Preliminary tests were conducted on a water phantom to verify the theory presented above. Images of a human patient were then taken on a scanner tailored to cardiac imaging. All images presented here were taken on the 1.5 T scanner.

Unless otherwise specified, imaging was done with a body coil for excitation and a cardiac phased-array assembly for detection. The two posterior phased-array coils were placed directly on the wooden board forming the top face of the gradient insert. A normal volunteer lay directly on the back surface coil, a distance of about 25 mm from the gradient wire. Spoil depths are reported relative to the gradient current elements rather than the surface of the subject's back. Torque-balancing in the gradient insert was adequate to prevent the board from moving during the experiments, but it vibrated somewhat and generated sound during the imaging.

To test the controllability of the spoil depth, images were taken of a phantom ($MnCl_2$ and $CuSO_4$ in water), using a fixed pulse length of 1.12 milliseconds and variable spoiler current. FIGS. 5A–5H show a series of representative sagittal images taken with 7×2.34×1.17 mm resolution along the x-, y-, and z-directions, respectively (through-plane, vertical, and horizontal in the figures). The current was stepped between 0 A and 140 A in 20 A increments. The spoil boundary has a scalloped shape, with deepest spoils over the current elements, where the y-gradient is maximum. This results from voxels that are wider along the y-direction than along z-direction. Spin excitation and detection were done using a surface coil, which rested directly on the gradient insert 32 and raised the bottom of the phantom about 38 mm above the gradient wires. The vertical phase-encode artifacts apparent in the images result from incomplete rf isolation during the experiment.

Figure 6:
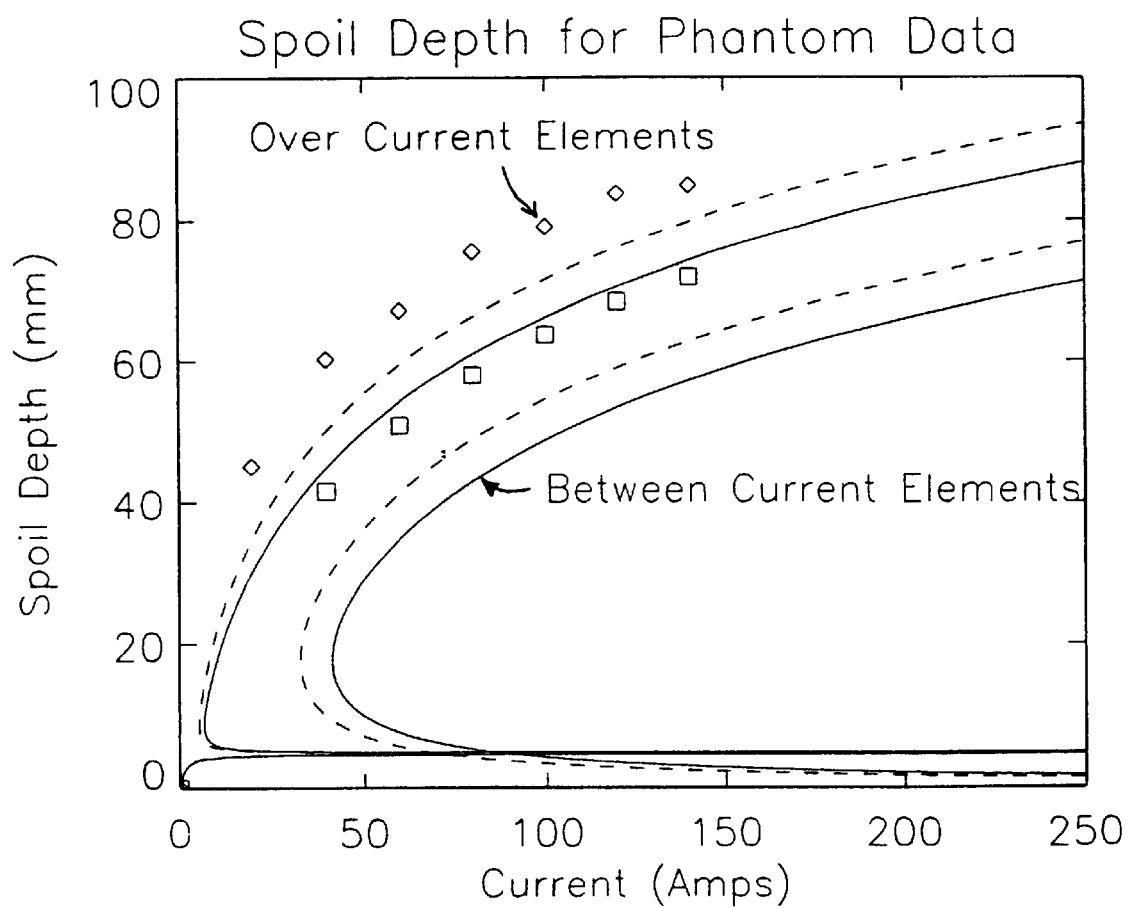
FIG. 6 is a graph of the spoil depth versus current for the images of FIGS. 5A through 5H compared with calculated spoil depth.

The depth of the spoiled region increases with current, as shown by the graph shown in FIG. 6. Diamond markers represent spoil depths over the current elements, and square markers show the spoil depths between the current elements. The spoil depth was determined visually. In the empirical results, the perceived spoil boundary corresponded to a spoil factor $\xi$ of about 5–15 percent, depending upon the signal-to-noise ratio (SNR). These data were compared to theoretical values calculated using equation 5 for the two positions. Lines in FIG. 6 show the locus of points at which $\xi=0.05$ (solid) and $\xi=0.15$ (dashed). The upper two lines correspond to spoiling over the current elements, and the lower two lines refer to spoiling between the current elements. Asymptotically the spoil depths scale approximately logarithmically with increasing current.

While the theoretical curves show the observed behavior qualitatively, the actual spoil depth is consistently deeper than predicted. Both theoretical curves can be brought into excellent agreement with the data, however, by increasing the width of the point-response function by 50%. This observation points to the limitations of the Gaussian assumption of Equation 3 and suggests that actual resolution is 50% worse than the hardware settings indicate, for example, because of $T_2\star$ effects. At distances of less than 20 mm, comparable to the width of a current element, the spoiling may become incomplete, as evidenced by the multi-valued behavior of the theoretical curves. In practice, the sample is placed far enough away from the gradient insert 32 that these crossovers have no bearing on the spoiler performance.

Figure 7A:
FIG. 7A shows an axial slice through a heart without spoiling.
Figure 7B:
FIG. 7B shows an axial slice through the heart with spoiling, in accordance with the present invention.

FIG. 7A shows a representative GRE image of an axial slice through the heart taken with a time echo/time recovery (TE/TR) of 3.3/7.9 milliseconds and no current to the spoiler. The slice thickness was 8.0 mm, the FOV was 360 mm by 270 mm, and the resolution was 250 by 160. FIG. 7B shows a representative scan taken under otherwise identical conditions, but with a 0.70 ms, 100 A spoiler current pulse. The effectiveness of the spoiler gradient is readily apparent. In the image with spoiling (FIG. 7B), the signal from the back is entirely eliminated to a depth of about 80 mm. For these experimental conditions, equation 5 predicts a spoil depth between 50 mm and 85 mm, depending on the slice position relative to the spoiler current elements. (Spoiling is deepest between the wires, where the z-gradient is maximum, since the z-direction corresponds to the widest voxel dimension). Accordingly, the observed spoil depth is in good agreement with the predicted spoil depth.

Figure 8A:
FIG. 8A represents a sagittal image through the heart under wide FOV conditions without back image suppression.
Figure 8C:
FIG. 8C represents a sagittal image through the heart under wide FOV conditions and with back image suppression.
Figure 8B:
FIG. 8B represents a sagittal image through the heart under narrow FOV conditions without back image suppression, showing aliasing artifacts of the back overlapping the heart image.
Figure 8D:
FIG. 8D represents a sagittal image through the heart under narrow FOV conditions with back image suppression.

The impact of the gradient insert 32 on de-aliasing and FOV reduction is illustrated in FIGS. 8A–8D, which show representations of four sagittal views of a human subject, collected with flow compensation. All images were taken with TE/TR of 3.4 ms/8.0 ms, cardiac gating of 20 phases, and 256 by 160 resolution. Horizontal zipper artifacts are due to incomplete rf isolation. FIG. 8A represents a wide FOV image (480 mm by 240 mm), showing the heart clearly with only slight wrap and no overlap of the aliased images. In FIG. 8B, the FOV is reduced (320 mm by 160 mm), but the MR signal from subcutaneous fat of the back now intersects the heart, making the image impossible to analyze quantitatively. In fact, the situation usually is worse than this: the aliased signal from the back would be much brighter if the back coils had not been slightly detuned by proximity to the gradient insert. FIGS. 8C and 8D are images corresponding to the two scans of FIGS. 8A and 8B, respectively, showing the suppression of the back signal using the gradient insert of the present invention. As seen in FIG. 8D, use of the gradient insert eliminates the interference of the aliased back with the heart in the reduced FOV.

The data and images presented herein show that the use of a gradient insert during imaging, in accordance with the present invention, may provide dramatic levels of signal suppression from unwanted regions of a patient. Spoil depths of 80 mm have been attained in tests, and these depths could be increased with some additional design modification.

There are a number of applications for the methods and apparatus of the invention. For example, the spoiler gradient allows reduction of the FOV by half or more without causing aliasing artifacts. Accordingly, imaging times may be cut in half at a given resolution. For cardiac applications, this enables images to be collected with shorter breath holds, making the imaging less susceptible to patient motion and less taxing on seriously ill patients who cannot hold their breath for long periods. As another example, the effective suppression of subcutaneous fat is beneficial in abdominal scanning, in which fat and respiratory motion cause ghosting artifacts and where the region of interest (e.g., a tumor) may be small compared to the abdominal size. Further, use of the insert 32 to eliminate bright, but unimportant, regions of an image allows one to boost the detector preamplifiers of the MRI system without saturation, thereby increasing the dynamic range of the images.

Although the gradient insert 32 of the invention was tested for GRE imaging, it may be used in conjunction with most of the common MRI scanning procedures. The tests presented were taken with and without flow compensation. Flow compensation and flow encoding make the requirements on the gradient less severe, since the gradient can run continuously over longer time periods (2 to 3 milliseconds) while the flow pulses are applied. For spin echo imaging, spoiling can be accomplished by running the current forward between the 90 degree and 180 degree pulses, and then backwards between the 180 degree and the readout pulse for further dephasing, if desired. Other fast scanning techniques, such as spiral, EPI, and fast spin echo, should similarly be compatible with the spoiling gradient of the invention.

In the insert configuration presented above, the spoil depth is limited to about 80 mm for a 2 ms pulse. However, the phased-array RF coil should be separated from the spoiler gradient insert 32 by at least. 20 mm. The phased-array coil itself takes up another 10 mm leaving a maximum depth of about 50 mm into the patient. For large patients, a deeper spoil may be desired, which could be obtained by adding more series current elements 40, perhaps underneath the plane of the board, or by using a more powerful gradient power supply. More efficient spoiler designs are likely using a target field design approach. Finally, full implementation of the invention envisions potting the insert into a rigid form built into the scanner bed platform and integrating the spoiler current control functions with the existing pulse sequence software provided by the various MRI apparatus manufacturer.

While the invention herein disclosed has been described by means of specific embodiments and applications thereof, numerous modifications and variations could be made thereto by those skilled in the art without departing from the scope of the invention set forth in the claims.

What is claimed is:

1. A method for suppressing a magnetic resonance signal from regions of an object outside of a predetermined field of view of a magnetic resonance image to allow for improvement of the image within the field of view, comprising:

providing at least one spoiler current pulse for generating a spoiler gradient;

configuring the spoiler gradient to provide selectably variable spoil depths, wherein the spoil depths are non-linearly related to the spoil current to enable increased spoil depths at relatively lower increased spoiler currents, the spoiler current configured and timed to locally interfere with and suppress the magnetic resonance signal from regions of the object outside of the field of view; and processing a magnetic resonance signal from the object to generate a magnetic resonance image of the regions of the object within the field of view.

2. A method for suppressing a magnetic resonance signal as defined in claim 1, wherein:

the magnetic resonance image is generated using a gradient recall echo sequence that includes a slice-select pulse and a substantially simultaneous rf pulse; and the spoiler current pulse is not applied during the rf pulse and is timed to be applied after completion of the rf pulse.

3. The method for suppressing a magnetic resonance signal of claim 1, wherein the non-linear relationship is a logarithmic relationship.

4. The method for suppressing a magnetic resonance signal of claim 1, wherein the spoiler gradient is configured to enable imaging times to be reduced at a given resolution for decreasing image artifacts.

5. A method for suppressing a magnetic resonance signal as defined claim 1, wherein:

the spoiler current is applied near the surface of the object;

the spoiler current suppresses the magnetic resonance signal a variable suppression depth into the object; and the variable suppression depth is proportional to the amplitude of the spoiler current.

6. A method for suppressing a magnetic resonance signal as defined in claim 1, wherein:

the object is a human patient;

the spoiler current pulse is applied using a coil oriented near the surface of the patient's back;

the regions of the patient inside the field of view include the patient's heart and the regions of the patient outside of the field of view includes subcutaneous fat along the patient's back; and the spoiler current pulse suppresses aliasing artifacts generated by the subcutaneous fat during processing of the magnetic resonance signal.

7. A method for suppressing a magnetic resonance signal from regions of an object outside of a predetermined field of view of a magnetic resonance image to allow for improvement of the image within the field of view, comprising:

providing at least one spoiler current pulse that is configured and timed to locally interfere with and suppress the magnetic resonance signal from regions of the object outside of the field of view; and processing a magnetic resonance signal from the object to generate a magnetic resonance image of the regions of the object within the field of view, the step of processing the magnetic resonance signal including increasing the dynamic range of the magnetic resonance image of the regions of the object within the field of view.

8. An insert for generating a spoiling magnetic gradient field, comprising:

a plurality of antiparallel current elements, wherein current flowing through adjacent current elements flows in opposite directions;

wherein each current element comprises a plurality of conductors; and wherein current supplied to the insert follows a series path such that the supplied current flows through each conductor of each current element.

9. A coil for spoiling a magnetic resonance signal from regions of an object outside of a predetermined field of view, comprising:

first and second series current loops that project a spoiling gradient field into the regions of the object outside of the field of view, wherein current flowing through the first current loop encloses a first area and flows in a first direction around the first area, and wherein current flowing through the second current loop encloses a second area and flows in a direction around the second area that is opposite the first direction.

10. An apparatus for performing magnetic resonance imaging of an object, comprising:

means for imaging, based on a magnetic resonance signal from the object, a portion of the object within a field of view that is less than a field of view associated with imaging the entire object; and a spoiler gradient insert for suppressing the magnetic resonance signal from a portion of the object outside of the field of view, the spoiler gradient insert comprising at least two main parallel current elements, each antiparallel current element having multiple closely spaced wires arranged in series for reducing current requirements and increasing spoil depth.

\* \* \* \* \*